United States Patent
Oh et al.

(10) Patent No.: US 12,272,535 B2
(45) Date of Patent: Apr. 8, 2025

(54) SPECTROSCOPIC ANALYSIS METHOD, METHOD FOR FABRICATING SEMICONDUCTOR DEVICE USING THE SAME, AND SUBSTRATE PROCESS SYSTEM USING THE SAME

(71) Applicant: Samsung Electronics Co., Ltd., Suwon-si (KR)

(72) Inventors: Se Jin Oh, Hwaseong-si (KR); Doo Young Gwak, Suwon-si (KR); Tae Hyun Kim, Suwon-si (KR); Sang Ki Nam, Seongnam-si (KR); Jae Ho Jang, Seoul (KR); Jin Kyou Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 162 days.

(21) Appl. No.: 17/673,903

(22) Filed: Feb. 17, 2022

(65) Prior Publication Data

US 2023/0066724 A1   Mar. 2, 2023

(30) Foreign Application Priority Data

Aug. 24, 2021   (KR) .................. 10-2021-0111391

(51) Int. Cl.
  *H01J 37/32*   (2006.01)
  *H01L 21/3065*   (2006.01)

(52) U.S. Cl.
  CPC .. *H01J 37/32963* (2013.01); *H01J 37/32972* (2013.01); *H01L 21/3065* (2013.01); *H01J 2237/334* (2013.01)

(58) Field of Classification Search
  None
  See application file for complete search history.

(56) References Cited

U.S. PATENT DOCUMENTS

| | | | |
|---|---|---|---|
| 5,871,658 A | 2/1999 | Tao et al. | |
| 6,153,115 A * | 11/2000 | Le ..................... | G01N 21/73 216/60 |
| 7,101,805 B2 | 9/2006 | Johnson et al. | |
| 7,169,625 B2 | 1/2007 | Davis et al. | |
| 7,427,519 B2 | 9/2008 | Lee | |
| 7,477,960 B2 | 1/2009 | Willis et al. | |
| 8,518,283 B2 | 8/2013 | Yamamoto et al. | |

FOREIGN PATENT DOCUMENTS

| | | |
|---|---|---|
| KR | 100708423 B1 | 4/2007 |
| KR | 100892248 B1 | 4/2009 |
| KR | 101117928 B1 | 2/2012 |

* cited by examiner

*Primary Examiner* — Stephanie P Duclair
(74) *Attorney, Agent, or Firm* — Muir Patent Law, PLLC

(57) ABSTRACT

A spectroscopic analysis method having improved accuracy and correlation, a method for fabricating a semiconductor device using the same, and a substrate process system using the same are provided. The spectroscopic analysis method includes receiving plasma light emitted from plasma to generate an emission spectrum, detecting n (here, n is a natural number of 2 or more) peak wavelengths from the emission spectrum, generating a plurality of correlation factor time series from correlation factors between the peak wavelengths, filtering the plurality of correlation factor time series, and analyzing the plasma, using the filtered correlation factor time series.

16 Claims, 11 Drawing Sheets

SPECTROSCOPIC ANALYSIS METHOD, METHOD FOR FABRICATING SEMICONDUCTOR DEVICE USING THE SAME, AND SUBSTRATE PROCESS SYSTEM USING THE SAME

This application claims the benefit of priority under 35 U.S.C. § 119 to Korean Patent Application No. 10-2021-0111391, filed on Aug. 24, 2021, the disclosure of which is incorporated herein by reference in its entirety.

BACKGROUND

1. Technical Field

The present inventive concept relates to a spectroscopic analysis method, a method for fabricating a semiconductor device using the same, and a substrate process system using the same. More specifically, the present inventive concept relates to a spectroscopic analysis method using optical emission spectroscopy (OPT), a method for fabricating a semiconductor device using the same, and a substrate process system using the same.

2. Description of the Related Art

A semiconductor device may be formed by various semiconductor fabricating processes such as an etching process, a deposition process, an ashing process, and a cleaning process. In particular, in recent years, various plasma processes which accelerate desired chemical reaction (e.g., deposition or etching) using plasma have been used.

Optical Emission Spectrometry (OES) may be used to optically diagnose the presence or absence of abnormality of the plasma process. The optical emission spectroscopy has an advantage of being able to analyze plasma generated in a process chamber, from the outside of the process chamber without insertion of a probe or the like.

SUMMARY

Aspects of the present inventive concept provide a spectroscopic analysis method having improved accuracy and correlation.

Aspects of the present inventive concept also provide a method for fabricating a semiconductor device using a spectroscopic analysis method having improved accuracy and correlation.

Aspects of the present inventive concept also provide a substrate process system using a spectroscopic analysis method having improved accuracy and correlation.

However, aspects of the present inventive concept are not restricted to the ones set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a method for fabricating a semiconductor device, the method comprising loading a substrate into a process chamber, processing the substrate, using plasma generated inside the process chamber, receiving plasma light emitted from the plasma to generate an emission spectrum, detecting n peak wavelengths from the emission spectrum, where n is a natural number of 2 or more, generating a plurality of correlation factor time series from correlation factors between the peak wavelengths, filtering the plurality of correlation factor time series, analyzing the substrate, using the filtered plurality of correlation factor time series, and terminating the processing of the substrate based on the analyzing of the substrate.

According to an aspect of the present inventive concept, there is provided a method for fabricating a semiconductor device, the method comprising loading a substrate into a process chamber, performing an etching process on the substrate, using plasma generated inside the process chamber, detecting an etching end point of the etching process, using a plasma light emitted from the plasma, and terminating the etching process after detecting the etching end point, wherein the detecting the etching end point includes receiving the plasma light to generate an emission spectrum, detecting n peak wavelengths from the emission spectrum, where n is a natural number of 2 or more, generating a plurality of correlation factor time series from correlation factors between the peak wavelengths, and detecting inflection points of the plurality of correlation factor time series.

According to an aspect of the present inventive concept, there is provided a spectroscopic analysis method comprising receiving plasma light emitted from plasma to generate an emission spectrum, detecting n peak wavelengths from the emission spectrum, where n is a natural number of 2 or more, generating a plurality of correlation factor time series from correlation factors between the peak wavelengths, filtering the plurality of correlation factor time series, analyzing the plasma, using the filtered plurality of correlation factor time series, and terminating a processing of a substrate based on the analyzing of the plasma.

BRIEF DESCRIPTION OF THE DRAWINGS

The above and other aspects and features of the present inventive concept will become more apparent by describing in detail exemplary embodiments thereof with reference to the attached drawings, in which like numerals refer to like elements throughout. In the drawings.

DETAILED DESCRIPTION OF THE EMBODIMENTS

Hereinafter, a substrate process system according to exemplary embodiments will be described referring to FIGS. 1 and 2.

A substrate process system according to some example embodiments may analyze a plasma state in the process chamber, using optical emission spectroscopy (OES) which is an optical diagnostic technique of plasma process. A substrate processed by the substrate process system according to some embodiments may be, for example, but is not limited to, a semiconductor substrate for fabricating a semiconductor device, a glass substrate for fabricating a flat plate display element, and the like. The processing process performed by the substrate process system according to some embodiments may be, for example, but is not limited to, an etching process, a deposition process, an ashing process, and a cleaning process.

Figure 1:
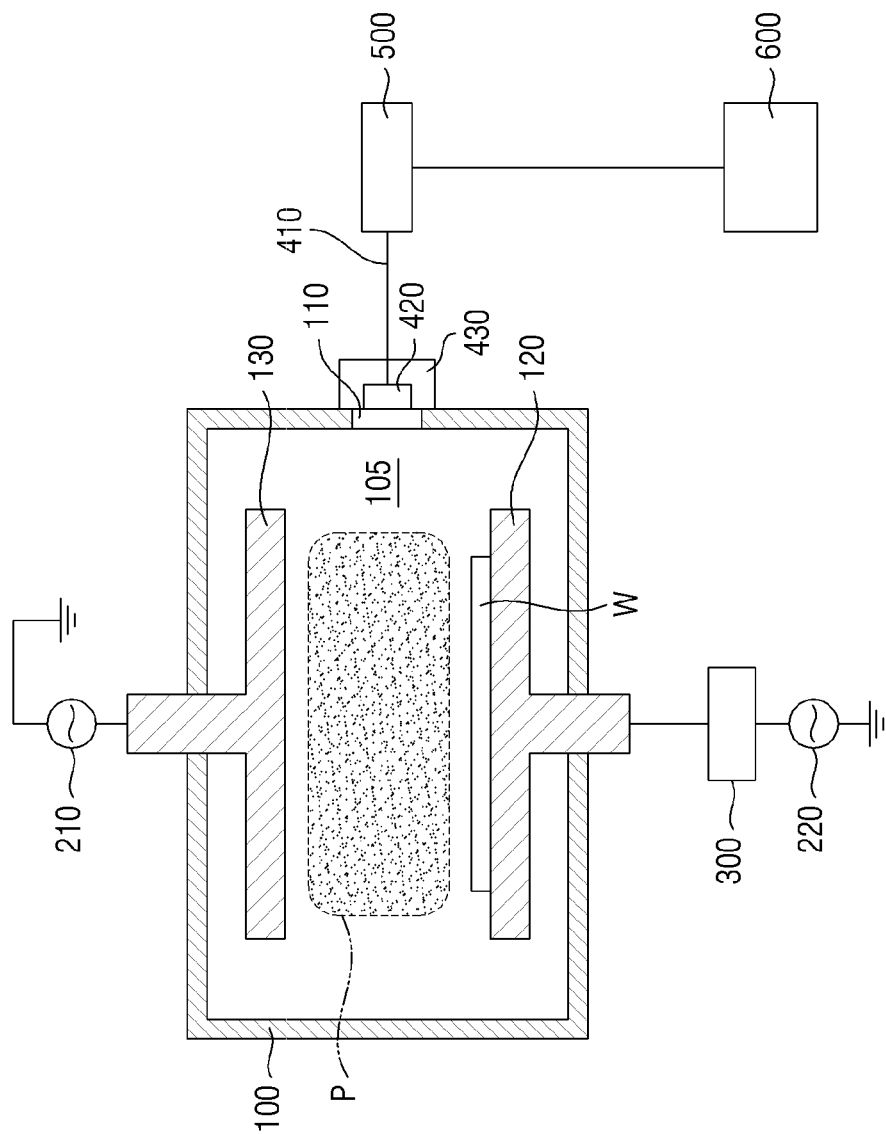
FIG. 1 is an exemplary diagram for explaining the substrate process system, according to some example embodiments.

FIG. 1 is an exemplary diagram for explaining the substrate process system according to some example embodiments. FIG. 2 is an exemplary diagram for explaining a spectrometer of FIG. 1.

Figure 2:
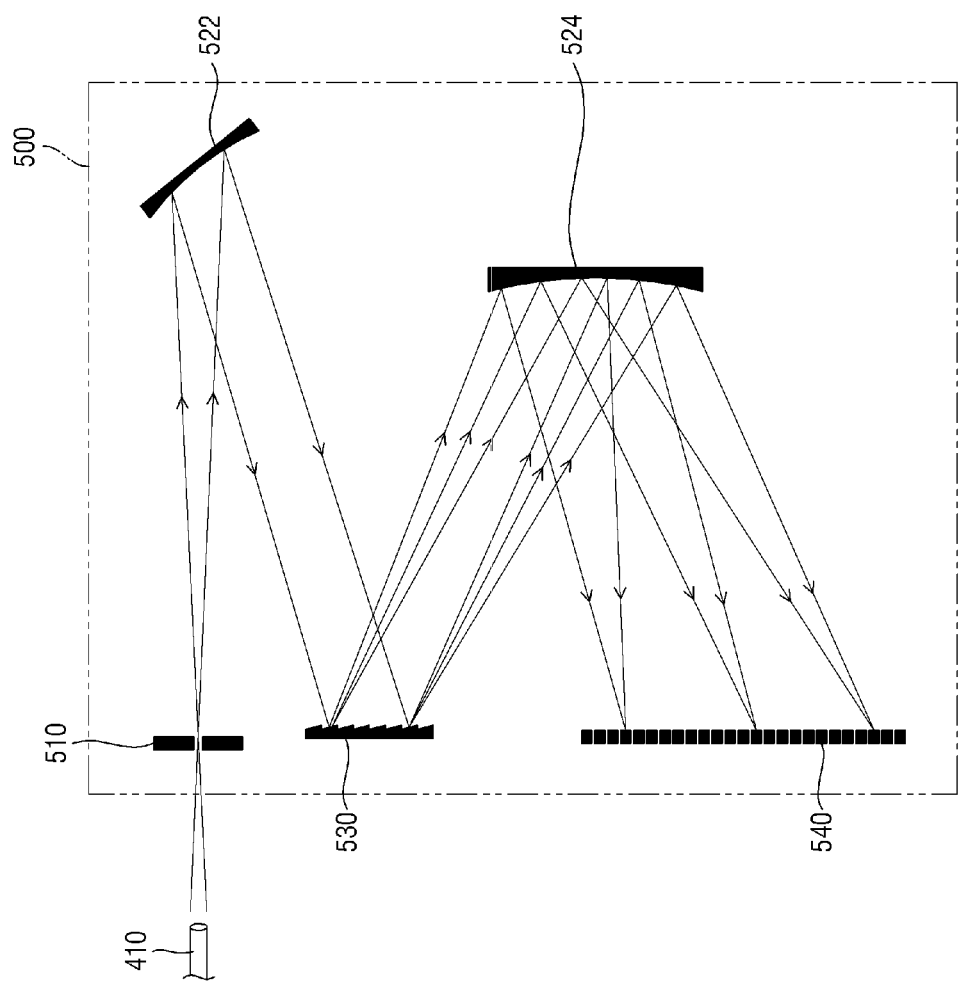
FIG. 2 is an exemplary diagram for explaining a spectrometer of FIG. 1.

Referring to FIGS. 1 and 2, the substrate process system according to some embodiments includes a process chamber 100, a stage 120, a shower head 130, a first power supply unit 210, a second power supply unit 220, a matcher 300, a spectrometer 500, and an analyzer 600.

The process chamber 100 may provide an internal space 105 for performing a processing process on a substrate W (e.g., a wafer). Plasma P is generated in the internal space 105, and the plasma process of the substrate W may be performed. The process chamber 100 may be provided by a closed structure so that the internal space 105 may be maintained in a vacuum (e.g., about 1 torr or less). The process chamber 100 may have various shapes such as, but not limited to, a hollow hexahedron or a hollow cylinder. The process chamber 100 may include, for example, but is not limited to, at least one of a metal and an insulator.

The process chamber 100 may include a window 110. The number and arrangement of windows 110 are merely exemplary and are not limited to those shown. The window 110 may receive the plasma light generated from the plasma P. The window 110 may include, but is not limited to, a material that allows plasma light to penetrate, for example, glass or quartz.

The stage 120 may be placed inside the internal space 105 of the process chamber 100 to support the substrate W. For example, the stage 120 may be placed in a lower part of the internal space 105. The substrate W may be loaded onto the stage 120. As an example, the stage 120 may be an electrostatic chuck that fixes the substrate W by electrostatic force. In some embodiments, the stage 120 may include a heater (not shown) for heating the substrate W to a temperature suitable for the plasma process.

The shower head 130 is placed inside the internal space 105 of the process chamber 100, and may supply the process gas into the process chamber 100. For example, the shower head 130 may be placed in an upper part of the internal space 105. The shower head 130 may face the stage 120. Accordingly, the shower head 130 may supply the process gas onto the substrate W loaded to the stage 120.

The first power supply unit 210 and the second power supply unit 220 may be connected to the shower head 130 and/or the stage 120, respectively. The first power supply unit 210 and the second power supply unit 220 may apply a radio frequency (RF) power source for generating or controlling the plasma P to the shower head 130 and/or the stage 120, respectively. As an example, the first power supply unit 210 may provide the shower head 130 with a first RF power, and the second power supply unit 220 may provide the stage 120 with a second RF power. In the following description, the shower head 130 connected to the first power supply unit 210 may also be referred to as an upper electrode, and the stage 120 connected to the second power supply unit 220 may also be referred to as a lower electrode.

The first power supply unit 210 may be an RF source power supplier which applies an RF source power. The first power supply unit 210 may form the plasma P inside the process chamber 100. For example, when the first RF power is applied from the first power supply unit 210 to the upper electrode (e.g., the shower head 130), an electric field may be generated by a potential difference between the lower electrode (e.g., the stage 120) and the upper electrode (e.g., the shower head 130). Therefore, the plasma P may be generated from the process gas supplied into the process chamber 100 by the shower head 130. In some embodiments, a plurality of first power supply units 210 may be provided.

The second power supply unit 220 may be an RF bias power supplier which applies an RF bias power. For example, when the second RF power is applied from the second power supply unit 220 to the lower electrode (e.g., the stage 120), cations generated from the plasma P may be incident toward the substrate W. In some embodiments, the frequency of the second RF power may be lower than the frequency of the first RF power. In an example, the frequency of the first RF power may be from about 13 MHz to about 14 MHz, and the frequency of the second RF power may be from about 12 MHz to about 13 MHz.

The matcher 300 may minimize the losses of RF power generated from the first power supply unit 210 and/or the second power supply unit 220. As an example, the matcher 300 may be interposed between the stage 120 and the second power supply unit 220 to improve the transmission efficiency of the second RF power applied to the stage 120. In some embodiments, although the matcher 300 may be placed to correspond to the number of the first power supply units 210 and the second power supply units 220, and may be connected to each of them, the illustration is omitted for convenience of explanation.

The spectrometer 500 may receive the plasma light that penetrates the window 110. For example, an optical fiber 410 may be provided adjacent to the window 110. The optical fiber 410 may receive the plasma light that penetrates the window 110, and transmit the received plasma light to the spectrometer 500.

In some embodiments, a filter 420 may be provided between the window 110 and the optical fiber 410. The filter 420 may filter at least a part of the plasma light received by the optical fiber 410. For example, the filter 420 may remove a noise component (e.g., noise amplified by reflection between the shower head 130 and the substrate W) generated inside the process chamber 100, by filtering at least a part of TE (Transverse Electric) mode components in the plasma light received by the optical fiber 410.

In some embodiments, a collimator 430 may be provided between the window 110 and the optical fiber 410. The collimator 430 may be located outside the window 110. The collimator 430 may be, but is not limited to, a collimator lens. The collimator 430 may collimate the plasma light received by the optical fiber 410.

The spectrometer 500 may disperse the plasma light transmitted from the optical fiber 410. As an example, as shown in FIG. 2, the spectrometer 500 may include an inlet slit 510, imaging mirrors 522 and 524, a diffraction grating 530, and an array detector 540.

The plasma light transmitted from the optical fiber 410 may be incident on the spectrometer 500 through the inlet slit 510. The imaging mirrors 522 and 524 may collect plasma light spreading from the inlet slit 510 to form an image on the array detector 540. The number and arrangement of the imaging mirrors 522 and 524 are merely exemplary and are not limited to those shown. The array detector 540 may be, for example, but is not limited to, a CCD (Charged Coupled Device). The diffraction grating 530 is placed at the center of an optical path from the inlet slit 510 to the array detector 540, and may disperse the plasma light according to the wavelength. The diffraction grating 530 may be, for example, but is not limited to, a reflection type diffraction grating. Accordingly, the light dispersed from the plasma light for each wavelength may form an image at different locations of the array detector 540. It goes without saying that the spectrometer 500 shown in FIG. 2 is merely exemplary and the spectrometer 500 may be provided in various other structures for performing optical emission spectroscopy.

The analyzer 600 is provided with data regarding the plasma light from the spectrometer 500, and may analyze the state of the plasma P. For example, data about plasma light provided through the array detector 540 may be transmitted to the analyzer 600. The spectroscopic analysis method using the analyzer 600 will be described more specifically in the description of FIGS. 3 to 9.

The analyzer 600 may include software (e.g., an analysis program) for analyzing the state of the plasma P from the data transmitted from the spectrometer 500. The analyzer 600 may include, for example, but is not limited to, at least one of a personal computer (PC), a desktop computer, a laptop computer, a computer workstation, a tablet PC, a server, a mobile computing device, and combinations thereof. The mobile computing device may be implemented as, for example, but is not limited to, a mobile phone, a smart phone, an enterprise digital assistant (EDA), a digital still camera, a digital video camera, a PMP (portable multimedia player), a PND (personal navigation device or portable navigation device), a mobile internet device (MID), a wearable computer, an Internet of Things (IOT) device, an Internet of Everything (IOE) device, an e-book, and the like.

Although not illustrated, the analyzer 600 can include one or more of the following components: at least one central processing unit (CPU) configured to execute computer program instructions to perform various processes and methods, random access memory (RAM) and read only memory (ROM) configured to access and store data and information and computer program instructions, input/output (I/O) devices configured to provide input and/or output to the analyzer 600 (e.g., keyboard, mouse, display, speakers, printers, modems, network cards, etc.), and storage media or other suitable type of memory (e.g., such as, for example, RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives, any type of tangible and non-transitory storage medium) where data and/or instructions can be stored. In addition, the analyzer 600 can include antennas, network interfaces that provide wireless and/or wire line digital and/or analog interface to one or more networks over one or more network connections (not shown), a power source that provides an appropriate alternating current (AC) or direct current (DC) to power one or more components of the analyzer 600, and a bus that allows communication among the various disclosed components of the analyzer 600.

Hereinafter, a spectroscopic analysis method according to the exemplary embodiments will be described referring to FIGS. 1 to 9.

FIGS. 3 to 7 are diagrams for explaining the spectroscopic analysis method according to some example embodiments. For convenience of explanation, repeated parts of contents explained above using FIGS. 1 and 2 will be briefly described or omitted. The spectroscopic analysis method according to example embodiments may be performed, for example, but is not limited to, by the analyzer 600 of FIG. 1.

Figure 3:
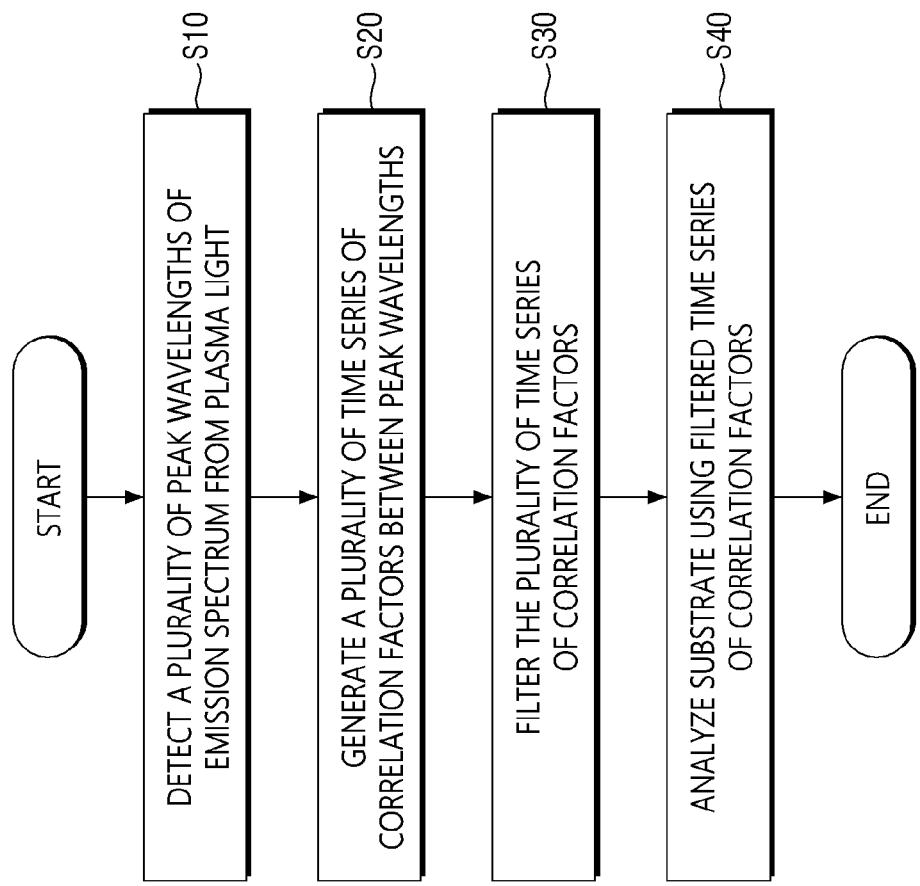
FIGS. 3 to 7 are diagrams for explaining the spectroscopic analysis method, according to some example embodiments.
Figure 4:
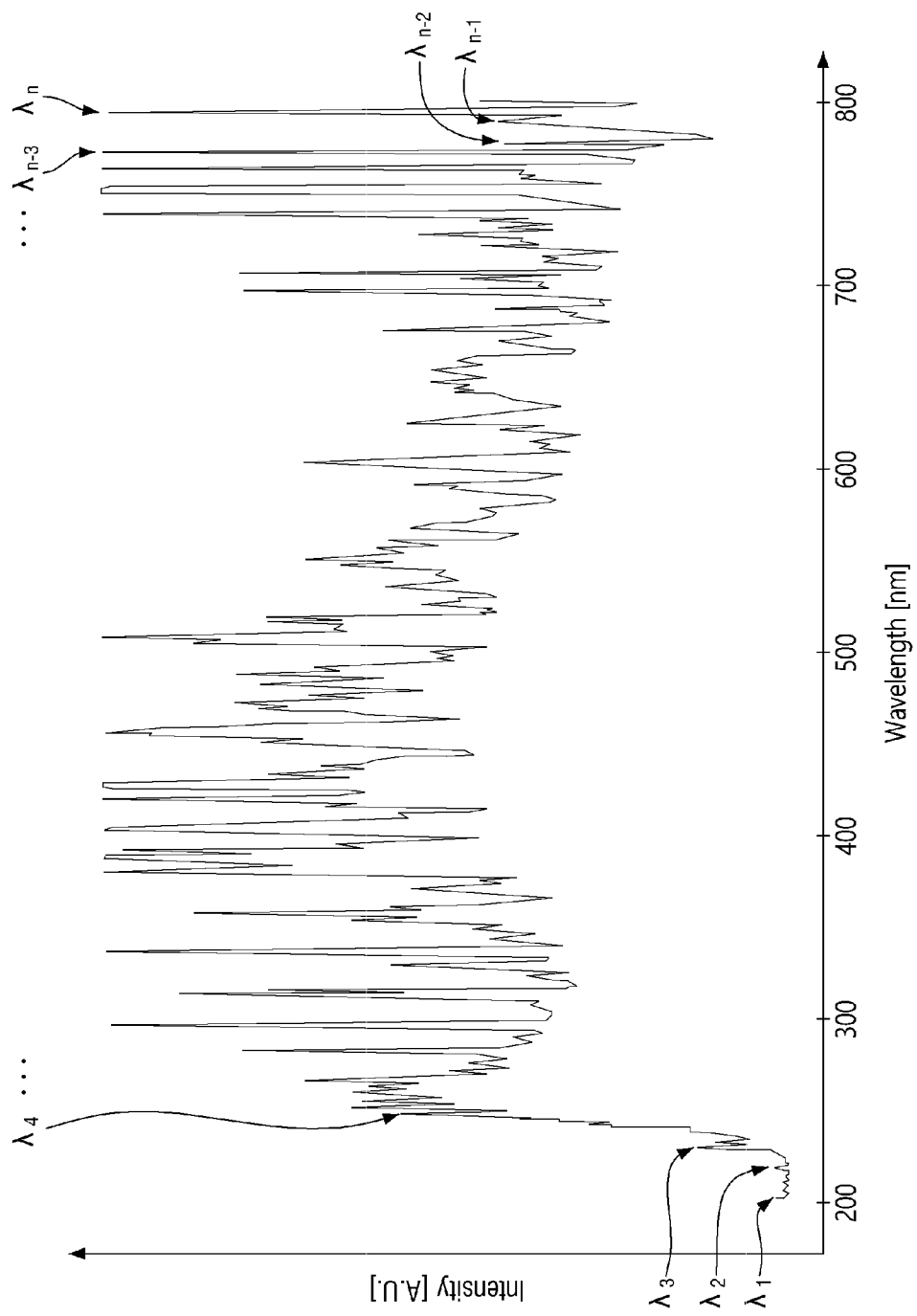

Referring to FIGS. 3 and 4, a plurality of peak wavelengths of the emission spectrum generated from the plasma light are detected (S10). For reference, FIG. 3 is a flowchart for explaining the spectroscopic analysis method according to some embodiments.

For example, the emission spectrum of FIG. 4 may be provided from the spectrometer 500 of FIGS. 1 and 2. As shown in FIG. 4, the emission spectrum may be provided as a graph by measuring the intensity according to the wavelength from the dispersed plasma light. In some embodiments, the emission spectrum may include a full spectrum of a predetermined wavelength range. As an example, as shown in FIG. 4, a full spectrum in which intensity is measured within the continuous wavelength range from 200 nm to 800 nm may be provided.

Next, a plurality of peak wavelengths may be detected from the emission spectrum. For example, as shown in FIG. 4, the analyzer 600 of FIG. 1 may detect n (here, n is a natural number of 2 or more) peak wavelengths $\lambda_1$ to $\lambda_n$ from the emission spectrum of FIG. 4.

Figure 5:
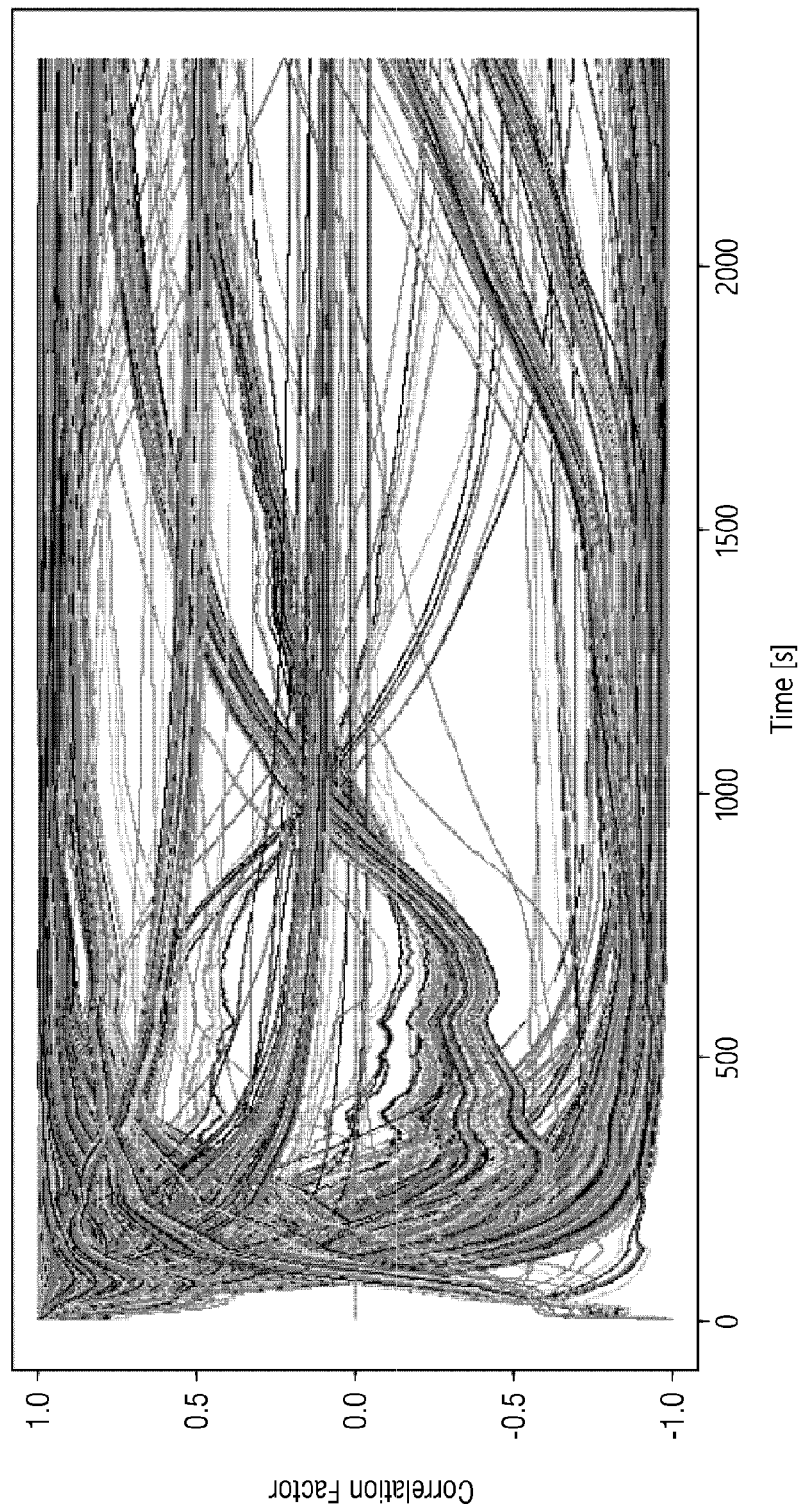

Referring to FIGS. 3 and 5, a plurality of correlation factor time series are generated from the correlation factors between the detected peak wavelengths (S20).

The correlation factor may include, for example, but is not limited to, at least one of a Pearson correlation coefficient, a Spearman correlation coefficient, a Cronbach's alpha coefficient, and a combination thereof.

In some embodiments, generation of each correlation factor time series may include derivation of a time integration correlation factor between two peak wavelengths of the n detected peak wavelengths $\lambda_1$ to $\lambda_n$ in time series. As an example, when the Pearson correlation coefficient is used as the correlation factor, a time integration correlation factor $r_{xy}$ between the two peak wavelengths (e.g., the first peak wavelength x and the second peak wavelength y) selected from the peak wavelengths $\lambda_1$ to $\lambda_n$ may be calculated as in the following Formula 1.

$$r_{xy} = \frac{COV(x, y)}{\sigma_x \sigma_y} = \frac{\sum_{k=1}^{n}(x_i - \bar{x})(y_i - \bar{y})/(n-1)}{\sqrt{\sum_{k=1}^{n}(x_i - \bar{x})^2/(n-1)}\sqrt{\sum_{k=1}^{n}(y_i - \bar{y})^2/(n-1)}} \quad \text{[Formula 1]}$$

For example, in the above Formula 1, $\sigma_x$ refers to a standard deviation of intensity data $x_1$ to $x_i$ of the first peak wavelength x measured with the lapse of the process time, and $\Gamma_y$ refers to a standard deviation of intensity data $y_1$ to $y_i$ of the second peak wavelength y measured with the lapse of the process time. Further, in the above Formula 1, the $COV(x,y)$ refers to a covariance of the intensity data $x_1$ to $x_i$ of the first peak wavelength x and the intensity data $y_1$ to $y_i$ of the second peak wavelength y.

Next, the time integration correlation factor $r_{xy}$ between the first peak wavelength x and the second peak wavelength y may be derived in time series with the lapse of time. Therefore, one correlation factor time series may be generated from the first peak wavelength x and the second peak wavelength y. In a similar method, another correlation factor time series may be generated from the correlation factors between the other two peak wavelengths selected from the peak wavelengths $\lambda_1$ to $\lambda_n$. For example, as shown in FIG. 5, the analyzer 600 of FIG. 1 may provide a plurality of correlation factor time series as a graph, by calculating the correlation factor between peak wavelengths with the lapse of time.

In some embodiments, the number of plurality of correlation factor time series generated from the n peak wavelengths $\lambda_1$ to $\lambda_n$ may be $_nC_2$ in total (i.e., n(n−1)/2). For example, the correlation factor time series may be generated for all combinations of the two peak wavelengths selected from the n peak wavelengths $\lambda_1$ to $\lambda_n$.

Figure 6:
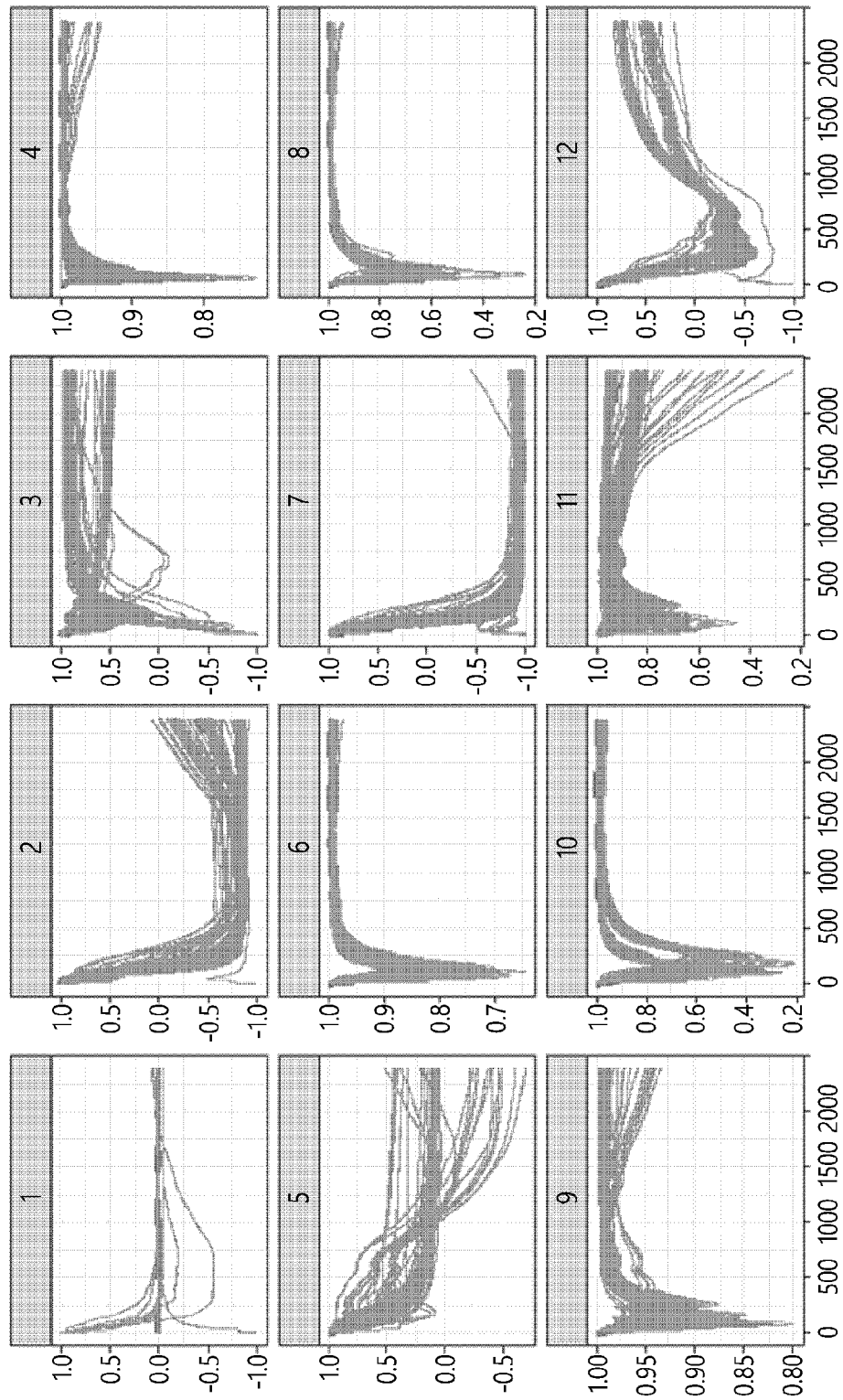
Figure 7:
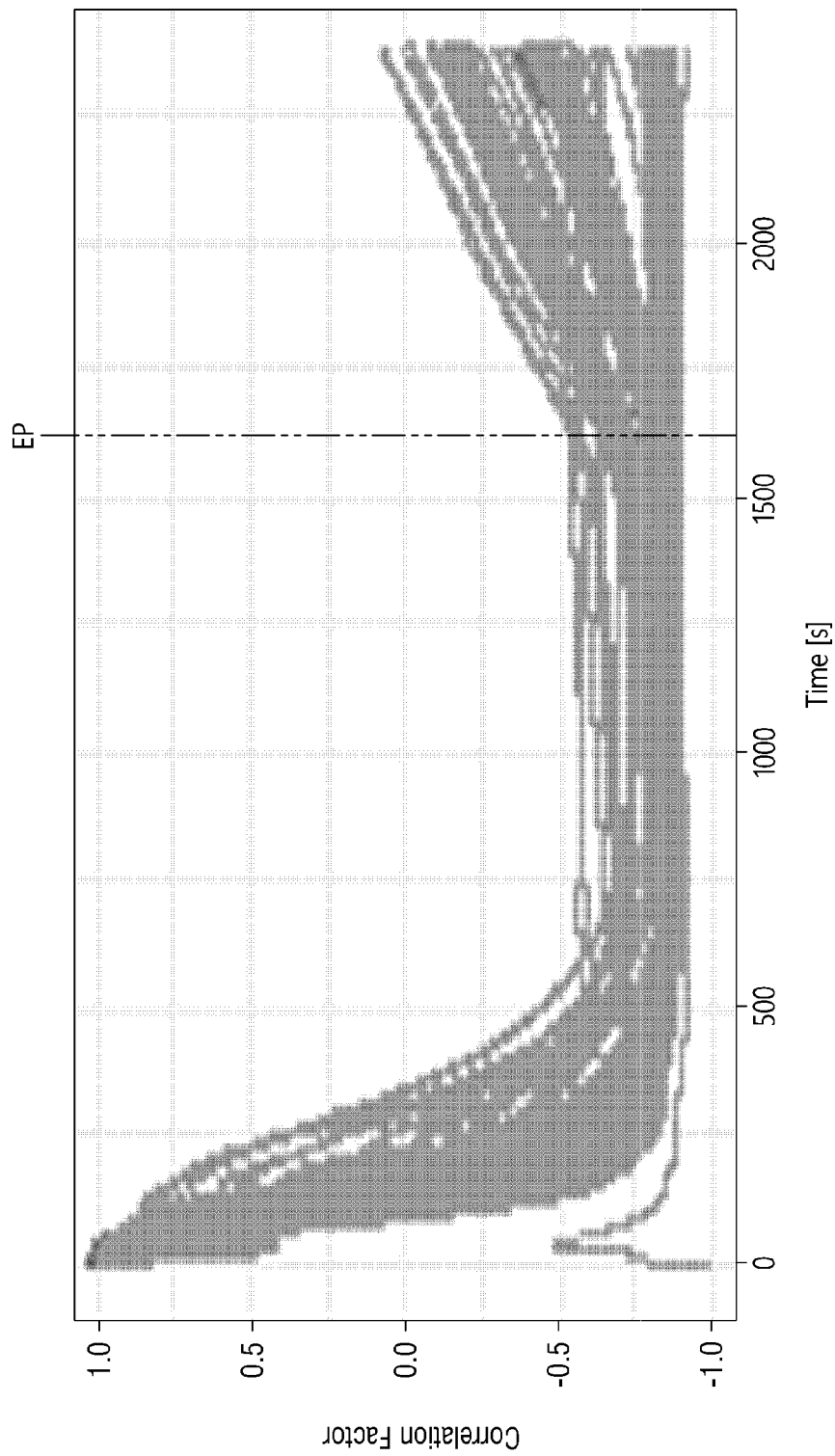

Referring to FIGS. 3, 6 and 7, a plurality of correlation factor time series is filtered (S30).

As an example, only some correlation factor time series that satisfy a predetermined criterion may be selected among the generated $_nC_2$ correlation factor time series. In some embodiments, filtering of the plurality of correlation factor time series may include clustering the generated plurality of correlation factor time series to generate a plurality of groups and selecting at least one group that satisfies a predetermined criterion among the generated plurality of groups.

For example, as shown in FIG. 6, the analyzer 600 of FIG. 1 may generate first to twelfth groups 1 to 12 each including classified correlation factor time series, by clustering the plurality of correlation factor time series of FIG. 5. The number of groups to be generated is only exemplary and is not limited thereto.

Next, at least one group that satisfies a predetermined criterion among the first to twelfth groups 1 to 12 of FIG. 6 may be selected. For example, as shown in FIG. 7, the analyzer 600 of FIG. 1 may select the second group 2 from the first to twelfth groups 1 to 12 of FIG. 6. Therefore, the analyzer 600 of FIG. 1 may provide a filtered correlation factor time series.

In some embodiments, selection of at least one group that satisfies a predetermined criterion may include selection of at least one group that satisfies a standard deviation of a predetermined range among the generated plurality of groups. For example, a group having a standard deviation of a predetermined standard deviation or more among the first to twelfth groups 1 to 12 may be selected, or a group having a standard deviation of a predetermined standard deviation or less among the first to twelfth groups 1 to 12 may be selected, and the filtered correlation factor time series may be provided.

Referring to FIGS. 3 and 7, the substrate (e.g., the substrate W of FIG. 1) is analyzed, using the filtered correlation factor time series (S40).

The filtered correlation factor time series may reflect the state of the plasma P generated in the process chamber 100 of FIG. 1. For example, as shown in FIG. 7, the analyzer 600 of FIG. 1 may detect an inflection point EP of the filtered correlation factor time series. Through the inflection point EP, a change in the substrate W may be inferred with progress of the plasma process. As an example, an etching end point of the etching process using the plasma P may be detected through the inflection point EP. The detection of the inflection point EP may be performed by various known methods such as a feature point detection algorithm.

Figure 8:
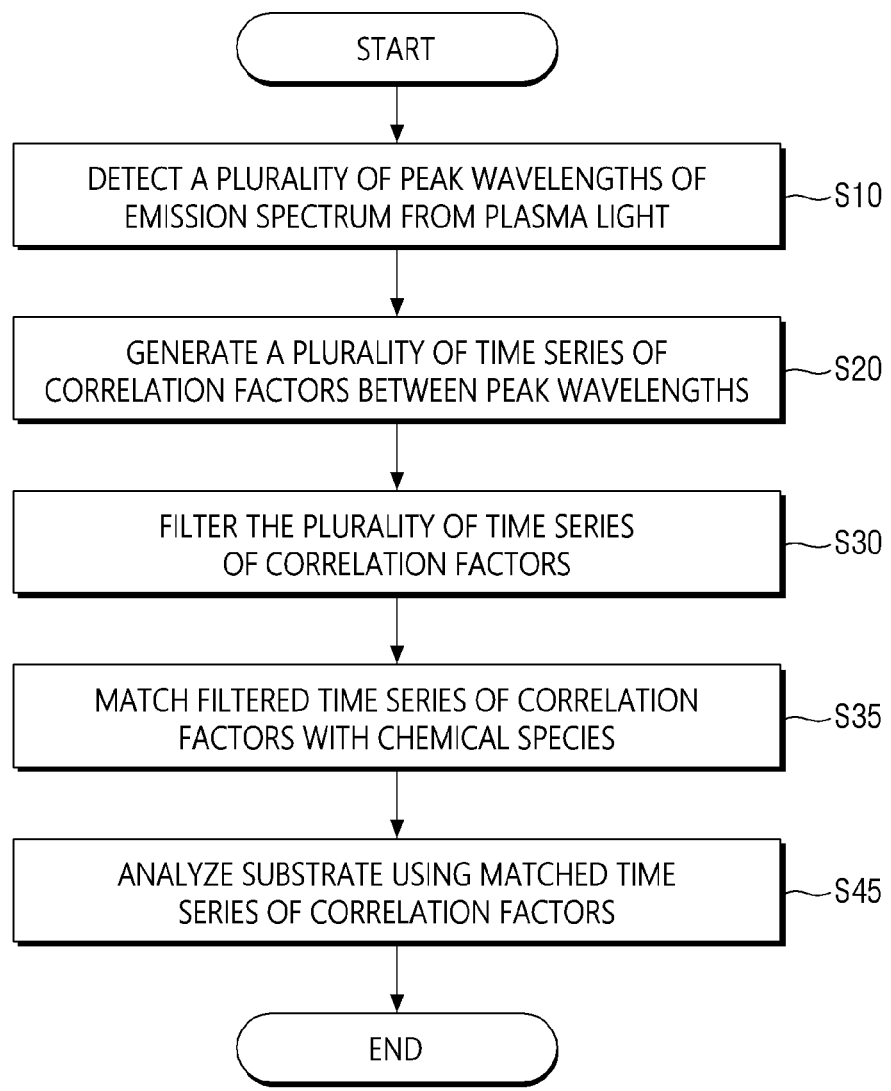
FIGS. 8 and 9 are diagrams for explaining a spectroscopic analysis method, according to some example embodiments.
Figure 9:
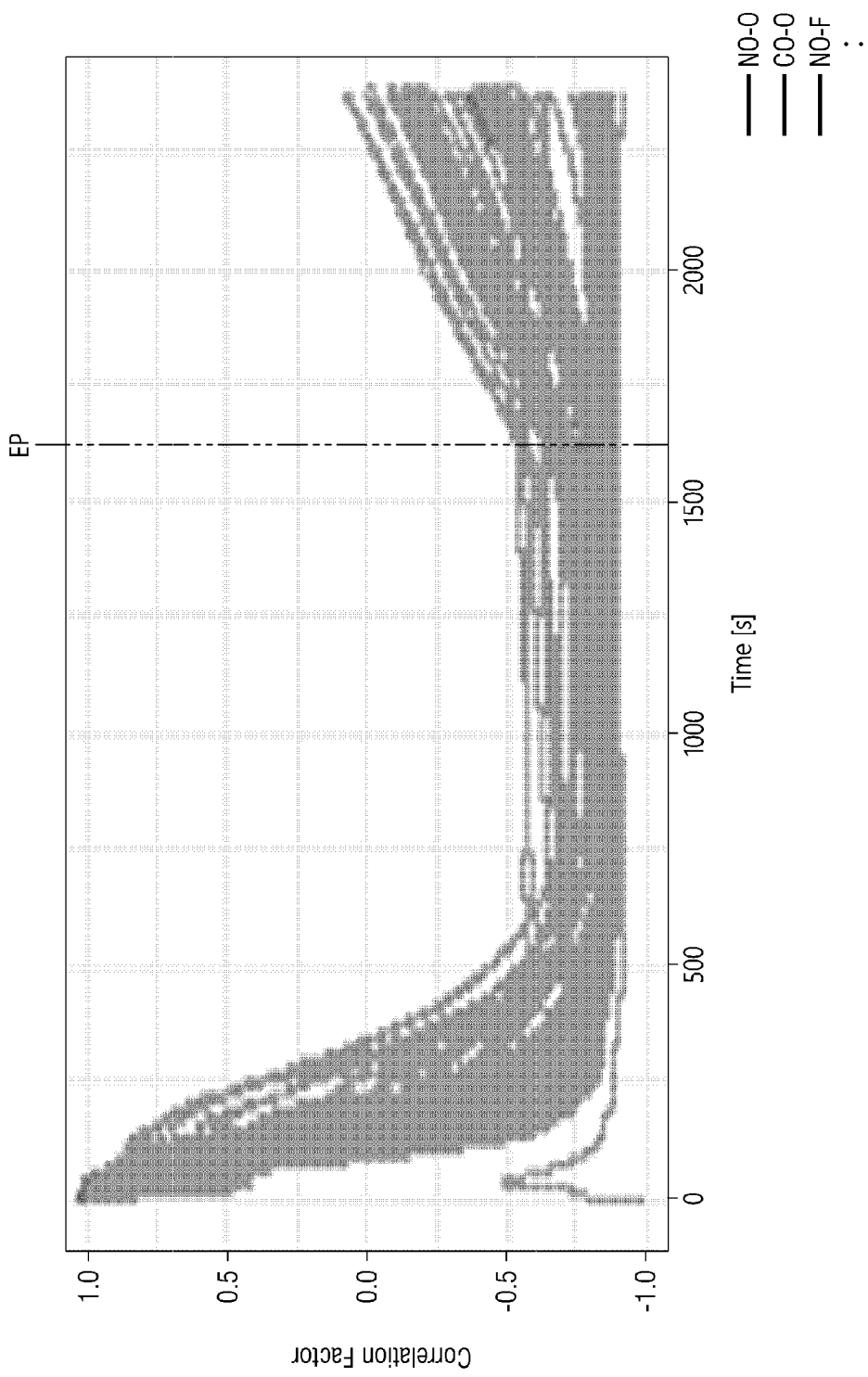

FIGS. 8 and 9 are diagrams for explaining a spectroscopic analysis method according to some embodiments. The spectroscopic analysis method according to example embodiments may be performed, for example, but is not limited to, by the analyzer 600 of FIG. 1. For convenience of explanation, repeated parts of contents explained above using FIGS. 1 to 7 will be briefly described or omitted.

Referring to FIGS. 8 and 9, the spectroscopic analysis method according to some embodiments includes a step of matching the filtered correlation factor time series with the chemical species (S35), and a step of analyzing the substrate (e.g., the substrate W of FIG. 1), using the matched correlation factor time series (S45). For reference, FIG. 9 is an exemplary graph for explaining the result in which the filtered correlation factor time series of FIG. 7 are matched with the corresponding chemical species.

Specifically, after filtering a plurality of correlation factor time series (S30), each correlation factor time series may be matched with the chemical species corresponding to the peak wavelengths $\lambda_1$ to $\lambda_n$ (S35). The chemical species may refer to active species or by-products generated according to the plasma process. In an example, the peak wavelength (e.g., $\lambda_1$) having a wavelength of about 206.0 nm among the detected peak wavelengths $\lambda_1$ to $\lambda_n$ may correspond to Si, $N_2$, CO, SiF, and the like. As another example, the peak wavelength (e.g., $\lambda_2$) having a wavelength of about 218.5 nm among the detected peak wavelengths $\lambda_1$ to $\lambda_n$ may correspond to CN, $C_2H_2$, CO, CO+, and the like. As mentioned above, the two selected peak wavelengths among the detected peak wavelengths $\lambda_1$ to $\lambda_n$ may generate one correlation factor time series. For example, as shown in FIG. 9, the analyzer 600 of FIG. 1 may match each filtered correlation factor time series with a chemical species pair (e.g., NO—O, CO—O, or NO—F, etc.) corresponding to the two selected peak wavelengths.

Next, the substrate W may be analyzed, using the matched correlation factor time series. The matched correlation factor time series may reflect the state of the plasma P generated in the process chamber 100 of FIG. 1. For example, as shown in FIG. 9, the analyzer 600 of FIG. 1 may detect the inflection point EP of the matched correlation factor time series. Because the detection of the inflection point EP is similar to that described above using FIG. 7, detailed description thereof will not be provided below.

As the semiconductor device gradually becomes highly integrated, existing spectroscopic methods for the plasma process are limited. For example, in the case of a spectroscopic analysis method that detects the inflection point of the etching process using a specific wavelength of the emission spectrum generated from the plasma light, a low signal-to-noise ratio (SNR) is exhibited in a semiconductor device of a fine pattern or a semiconductor device of a composite membrane, and there is a problem of difficulty in detecting the inflection point. However, as described above, because the spectroscopic analysis method according to some embodiments may utilize a plurality of peak wavelengths detected in a predetermined wavelength range and calculate the correlation factors between the peak wavelengths to analyze the plasma process, it is possible to have a high signal-to-noise ratio. Accordingly, it is possible to provide a spectroscopic analysis method which enables the detection of the precise inflection point and has improved accuracy.

Further, in the case of a spectroscopic analysis method that detects the inflection point using the full spectrum-based data statistical analysis about the emission spectrum, since there is no specific physical meaning for the derived components, there is a difficulty in analyzing correlation with the plasma process results. However, as mentioned above, because the spectroscopic analysis method according to some embodiments utilizes the correlation factor time series that may be matched with the corresponding chemical species, it is possible to have physical meaning for active species or by-products generated according to the plasma process. Accordingly, it is possible to provide a spectroscopic analysis method having an improved correlation with the plasma process results.

Hereinafter, a method for fabricating a semiconductor device according to an exemplary embodiment will be described referring to FIGS. 1 to 12.

Figure 10:
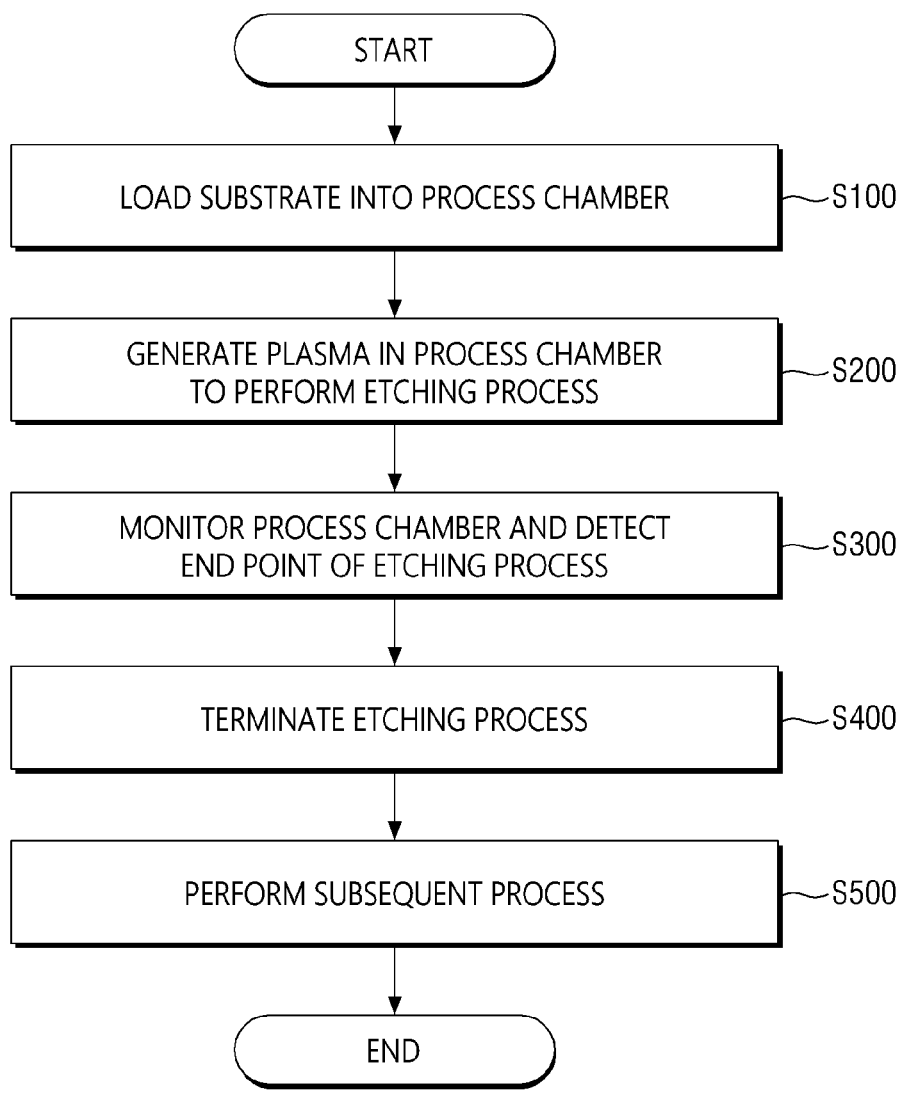
FIGS. 10 to 12 are diagrams for explaining a method for fabricating a semiconductor device, according to some example embodiments.
Figure 11:
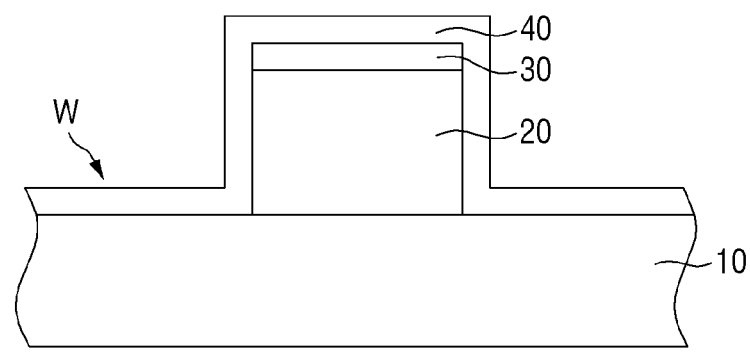
Figure 12:
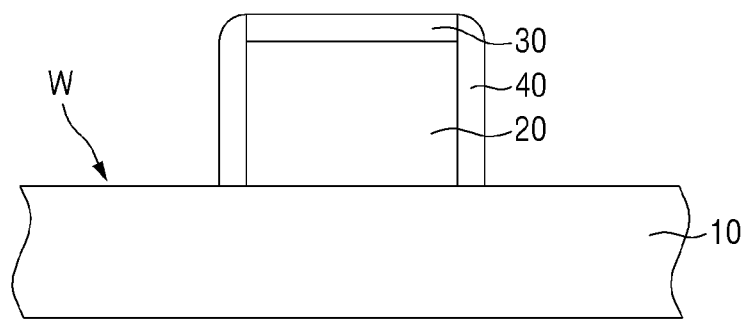

FIGS. 10 to 12 are diagrams for explaining a method for fabricating a semiconductor device according to some example embodiments. For convenience of explanation, repeated parts of contents explained above using FIGS. 1 and 2 will be briefly described or omitted. For reference, FIG. 10 is a flowchart for explaining the method for fabricating the semiconductor device according to some embodiments. Although the method for fabricating the semiconductor device described referring to FIGS. 10 to 12 will be described focusing on an etching process, this is merely an example. As another example, it goes without saying that the method for fabricating the semiconductor device according to some embodiments may be applied to various other plasma processes such as a deposition process, an ashing process, and a cleaning process.

Referring to FIGS. 1, 10 and 11, the substrate W is loaded into the process chamber 100 (S100).

The substrate W may include, for example, a semiconductor substrate 10, a pattern 20, an antireflection film 30, and an etching target film 40. The pattern 20, the antireflection film 30, and the etching target film 40 may be formed on the semiconductor substrate 10.

The semiconductor substrate 10 may be bulk silicon or silicon on insulator (SOI). In contrast, the semiconductor substrate 10 may be a silicon substrate, or may include other materials, for example, but is not limited to, silicon germanium, silicon germanium on-insulator (SGOI), indium antimonide, lead tellurium compounds, indium arsenide, indium phosphide, gallium arsenide or gallium antimonide. For convenience of explanation, the semiconductor substrate 10 will be described as a silicon substrate.

The pattern 20 may be a fine pattern formed on the semiconductor substrate 10 to implement the semiconductor device. The antireflection film 30 may be formed on the pattern 20. The etching target film 40 may be formed on the pattern 20 and the antireflection film 30. The semiconductor substrate 10, the pattern 20, and the antireflection film 30 may correspond to non-etching target films.

The etching target film 40 may include at least one of a semiconductor material, a conductive material, an insulating material, and a combination thereof. As an example, the etching target film 40 may include a semiconductor material such as polysilicon and/or an epitaxial layer. As another example, the etching target film 40 may include a conductive material such as doped polysilicon, metal, metal silicide, and/or metal nitride. As still another example, the etching target film 40 may include an insulating material such as silicon oxide, silicon nitride, silicon oxynitride, a lower dielectric constant (low-k) material having a dielectric constant lower than that of silicon oxide, and/or a high dielectric constant (high-k) material having a dielectric constant higher than that of silicon oxide.

Although the etching target film 40 is shown only as being formed of a single film, this is merely an example, and the etching target film 40 may, of course, be formed of a multi-film in which a plurality of films is stacked. As an example, the etching target film 40 may include a plurality of stacked insulating films, or may include a conductive film or a semiconductor film interposed between the stacked insulating films.

Referring to FIGS. 1, 10 and 12, a plasma P is generated in the process chamber 100 to perform an etching process (S200), the process chamber 100 is monitored, the etching end point of the etching process is detected (S300), and the etching process is terminated (S400).

The etching process may be performed (S200), for example, by the first power supply unit 210 and the second power supply unit 220. For example, the plasma P may be formed in the process chamber 100 by the first power supply unit 210, and cations generated from the plasma P by the second power supply unit 220 may be incident toward the substrate W. Accordingly, the etching process on the etching target film 40 may be performed.

Monitoring (S300) of the process chamber 100 and detecting of the etching end point of the etching process may be performed, for example, by the spectrometer 500 and the analyzer 600. For example, the spectrometer 500 may disperse the plasma light generated from the plasma P in the process chamber 100 and transmit it to the analyzer 600. The analyzer 600 may monitor the process chamber 100 using the spectroscopic analysis method described above using FIGS. 3 to 9, and detect the etching end point. As an example, as described above in explanation of FIG. 7, the analyzer 600 may detect the etching end point by detecting the inflection point EP. The inflection point EP may be detected using the processes described above in connection with FIGS. 3-9.

When the etching end point is detected, the etching process may be terminated (S400). For example, as shown in FIG. 12, as the etching process of the etching target film 40 is performed, an upper surface of the semiconductor substrate 10 may be exposed, and the state of the plasma P inside the process chamber 100 may change. Therefore, the analyzer 600 may detect the time point at which the upper surface of the semiconductor substrate 10 is exposed as the etching end point, using the spectroscopic analysis method described above using FIGS. 3 to 9. As an example, the analyzer 600 may detect the inflection point EP of FIG. 7 as the etching end point. Thus, the etching process may be terminated based on the analysis performed by the analyzer 600.

Next, referring to FIG. 10, a subsequent process is performed (S500).

The subsequent process may include various semiconductor processes on the substrate W. For example, the semiconductor process may include, but is not limited to, a deposition process, an etching process, an ion process, a cleaning process, and the like. The semiconductor process on the substrate W may include a test process on the semiconductor device of a wafer level. As the subsequent process on the substrate W is performed, various integrated circuits and wirings required for the semiconductor device may be formed.

When semiconductor chips are completed inside substrate W through a semiconductor process on the substrate W (e.g., a wafer), the substrate W may be individualized to form a plurality of individual semiconductor chips. Individualization to a plurality of individual semiconductor chips may be achieved by a blade or a sawing process using laser. After that, a packaging process may be performed on each semiconductor chip. The packaging process may mean a process in which each semiconductor chip is mounted on a circuit board (for example, a printed circuit board (PCB)) and sealed with a sealing material. Further, the packaging process may include a process of stacking a plurality of semiconductor chips on the circuit board in multi-layers to form a stack package, or a process of stacking a stack package on the stack package to form a package-on-package (POP) structure. The semiconductor package may be formed through the packaging process on each semiconductor chip.

The semiconductor process on the substrate W may include a test process on the semiconductor device of the package level.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A method for fabricating a semiconductor device, the method comprising:
   loading a substrate into a process chamber;
   processing the substrate, using plasma generated inside the process chamber;
   receiving plasma light emitted from the plasma generated inside the process chamber to generate an emission spectrum;
   detecting n peak wavelengths from the emission spectrum, where n is a natural number of 2 or more;
   generating a plurality of correlation factor time series from correlation factors between the peak wavelengths;
   filtering the plurality of correlation factor time series;
   analyzing the substrate while the substrate is processing in the process chamber, using the filtered plurality of correlation factor time series; and
   terminating the processing of the substrate based on the analyzing of the substrate,
   wherein the generating each of the plurality of correlation factor time series includes deriving a time integration correlation factor between two peak wavelengths among the n peak wavelengths in time series,
   wherein the processing the substrate includes performing an etching process on the substrate, and
   wherein the analyzing the substrate includes detecting an etching end point of the etching process.

2. The method for fabricating the semiconductor device of claim 1, wherein the emission spectrum includes a full spectrum of a predetermined wavelength range.

3. The method for fabricating the semiconductor device of claim 1, wherein the filtering the plurality of correlation factor time series includes:
   clustering the plurality of correlation factor time series to generate a plurality of groups; and
   selecting at least one group which satisfies a predetermined criterion among the generated plurality of groups.

4. The method for fabricating the semiconductor device of claim 3, wherein the selecting the at least one group which satisfies the predetermined criterion includes selecting at least one group which satisfies a standard deviation of a predetermined range among the generated plurality of groups.

5. The method for fabricating the semiconductor device of claim 1, wherein the analyzing the substrate includes detecting an inflection point of the plurality of filtered correlation factor time series.

6. The method for fabricating the semiconductor device of claim 1, further comprising:

after filtering the plurality of correlation factor time series, matching each correlation factor time series with chemical species corresponding to the peak wavelengths.

7. The method for fabricating the semiconductor device of claim 6, wherein the analyzing the substrate includes analyzing the matched correlation factor time series.

8. A method for fabricating a semiconductor device, the method comprising:
   loading a substrate into a process chamber;
   performing an etching process on the substrate, using plasma generated inside the process chamber;
   detecting an etching end point of the etching process, using a plasma light emitted from the plasma generated inside the process chamber; and
   terminating the etching process after detecting the etching end point,
   wherein the detecting the etching end point includes:
      receiving the plasma light emitted from the plasma generated inside the process chamber to generate an emission spectrum;
      detecting n peak wavelengths from the emission spectrum, where n is a natural number of 2 or more;
      generating a plurality of correlation factor time series from correlation factors between the peak wavelengths; and
      detecting inflection points of the plurality of correlation factor time series.

9. The method for fabricating the semiconductor device of claim 8, wherein the detecting the inflection points of the plurality of correlation factor time series includes:
   filtering the generated plurality of correlation factor time series; and
   detecting the inflection points of the filtered correlation factor time series.

10. The method for fabricating the semiconductor device of claim 8, further comprising:
    monitoring the process chamber, using the plasma light.

11. The method for fabricating the semiconductor device of claim 8, further comprising:
    performing a semiconductor process on the substrate, after terminating the etching process.

12. A spectroscopic analysis method comprising:
    receiving plasma light generated inside a process chamber emitted from plasma to generate an emission spectrum;
    detecting n peak wavelengths from the emission spectrum, where n is a natural number of 2 or more;
    generating a plurality of correlation factor time series from correlation factors between the peak wavelengths;
    filtering the plurality of correlation factor time series;
    analyzing the plasma, using the filtered plurality of correlation factor time series; and
    terminating a processing of a substrate based on the analyzing of the plasma,
    wherein the generating the plurality of correlation factor time series includes deriving a time integration correlation factor between two peak wavelengths among the n peak wavelengths in a time series to generate $_nC_2$ correlation factor time series,
    wherein the plasma light is generated inside the process chamber while a substrate is being processed,
    wherein the processing the substrate includes performing an etching process on the substrate, and
    wherein the analyzing the substrate includes detecting an etching end point of the etching process.

13. The spectroscopic analysis method of claim 12, wherein the emission spectrum includes a full spectrum of a predetermined wavelength range.

14. The spectroscopic analysis method of claim 12, wherein the filtering the plurality of correlation factor time series includes:
   clustering the plurality of correlation factor time series to generate a plurality of groups; and
   selecting at least one group which satisfies a predetermined criterion among the generated plurality of groups.

15. The spectroscopic analysis method of claim 12, wherein the analyzing the plasma includes detecting an inflection point of the filtered plurality of correlation factor time series.

16. The spectroscopic analysis method of claim 12, further comprising:
   after filtering each of the plurality of correlation factor time series, matching each of the correlation factor time series with chemical species corresponding to the peak wavelengths,
   wherein the analyzing the plasma includes analyzing the matched correlation factor time series.

\* \* \* \* \*